(12) United States Patent
Winings

(10) Patent No.: US 6,250,968 B1
(45) Date of Patent: Jun. 26, 2001

(54) ELECTRICAL CONNECTOR SYSTEM WITH CROSS-TALK COMPENSATION

(75) Inventor: Clifford L. Winings, Etters, PA (US)

(73) Assignee: Berg Technology, Inc., Reno, NV (US)

( * ) Notice: Subject to any disclaimer, the term of this patent is extended or adjusted under 35 U.S.C. 154(b) by 0 days.

(21) Appl. No.: 09/353,184

(22) Filed: Jul. 14, 1999

(51) Int. Cl.[7] .................................................. H01R 23/02
(52) U.S. Cl. ........................ 439/676; 174/250; 174/261
(58) Field of Search ..................................... 439/676, 660, 439/941, 607, 608, 609, 610, 59; 361/803, 778; 257/776; 174/250, 261

(56) References Cited

U.S. PATENT DOCUMENTS

| | | | |
|---|---|---|---|
| 5,287,066 | 2/1994 | Liron et al. | 328/163 |
| 5,700,167 | 12/1997 | Pharney et al. | 439/676 |
| 5,797,764 | 8/1998 | Cooulombe et al. | 439/55 |
| 5,961,349 | * 10/1999 | Paagman | 439/607 |
| 6,107,578 | 8/2000 | Hashim | 174/250 |

FOREIGN PATENT DOCUMENTS

| | | |
|---|---|---|
| 0 856 853 A1 | 8/1998 | (EP) . |
| 0 880 202 A2 | 11/1998 | (EP) . |
| 2 331 873 | 6/1999 | (GB) . |
| WO 94/05092 | 3/1994 | (WO) . |

* cited by examiner

*Primary Examiner*—Gary F. Paumen
*Assistant Examiner*—Alexander Gilman
(74) *Attorney, Agent, or Firm*—Brian J. Hamilla; M. Richard Page

(57) ABSTRACT

An electrical connector system with an electrical connector having signal contacts exhibiting unwanted cross-talk; and a circuit substrate engaging the connector. The substrate has a plurality of layers and at least first, second and third traces, each corresponding to a respective signal contact. The first trace includes: a first portion on at least one of the layers and adjacent a portion of the second trace in order to produce a first compensating cross-talk; a second portion on at least another of the plurality of layers and adjacent a portion of the third trace in order to produce a second compensating cross-talk. The substrate could also comprise a board having a first layer, a second layer, a plurality of inner layers between said first and second layers, and a ground plane on at least a lower surface of said board. The inner layers have at least first, second and third traces, with the first trace having portions adjacent the second and third traces in order to produce a first and a second compensating cross-talk, respectively. The system reduces unwanted cross-talk by introducing a first compensating cross-talk by inductively and capacitively coupling a first conductor and a second conductor adjacent the first conductor; and introducing a second compensating cross-talk by capacitively coupling the first conductor and a third conductor once removed from the first conductor. The compensating cross-talks offset the unwanted cross-talk to produce an acceptable cross-talk.

20 Claims, 13 Drawing Sheets

ELECTRICAL CONNECTOR SYSTEM WITH CROSS-TALK COMPENSATION

BACKGROUND OF THE INVENTION

1. Field of the Invention

The present invention relates to electrical connector systems. More specifically, the present invention relates to electrical connector systems that minimize cross-talk.

2. Brief Description of Earlier Developments

The continuous increase in the operating speeds of electronic systems and the miniaturization of electrical connectors demand greater control of cross-talk. Cross-talk occurs when electromagnetic energy transmitted through a conductor in the connector causes electrical currents in the another conductor in the electrical connector. Near-end cross-talk (NEXT) travels in a direction opposite to the signal in the conductor. As an example, ANSI/EIA/TIA/568A Category 5 requirements limit pair-to-pair NEXT to −40 dB at 100 MHz. Some applications require such cross-talk performance, but measured on a power sum basis.

Various attempts have been made to control cross-talk within the connector. U.S. Pat. No. 5,562,479 describes an electrical connector in which a mating portion of the connector produces a "positive" cross-talk. Another portion of the connector arranges the conductors side-by-side in a plane to produce a "negative" cross-talk. The "negative" cross-talk cancels out the "positive" cross-talk.

U.S. Pat. No. 5,647,770 describes a modular jack in which adjacent conductor wires are crossed over for a portion of a length along an insert. The cross-talk produced in the cross-over portion cancels out the cross-talk produced in the portions of the conductor wire that are not crossed-over.

Various attempts have also been made to control cross-talk outside of the connector. British Patent Application GB 2 314 466 describes a compensation pattern on a multi-layer board (MLB) to which contacts from an electrical connector secure. The pattern uses vertically aligned arrays of conductive paths. Capacitive coupling between adjacent unlike paths produces a cross-talk that reduces the cross-talk produced by the connector. The pattern also staggers adjacent paths on a layer in order to allow coupling between non-adjacent paths.

European Patent Application number EP 0 854 664 also describes a compensation pattern on an MLB to which the electrical connector contacts connect. A portion of the conductive paths extend along one layer, while the remainder extends along another layer vertically spaced therefrom. The arrangement of the paths ensures that one path of a pair overlies at least two paths, each from a different pair.

SUMMARY OF THE INVENTION

It is an object of the present invention to provide an electrical connector system that exhibits suitable cross-talk characteristics.

It is a further object of the present invention to provide a compensation pattern on a multi-layer circuit substrate that reduces cross-talk in the connector to a desired level.

It is a further object of the present invention to provide a compensation pattern on a multi-layer circuit substrate that inductively and capacitively couples various differential signal pairs in order to reduce cross-talk to a desired level.

It is a further object of the present invention to provide a multi-layer circuit substrate with a compensation pattern having relatively small dimensions.

It is a further object of the present invention to provide a multi-layer circuit substrate with a compensation pattern sized to fit within a shield that surrounds the electrical connector secured to the circuit substrate.

It is a further object of the present invention to provide a multi-layer circuit substrate with a trace pattern that compensates for adjacent and non-adjacent conductors.

These and other objects of the present invention are achieved in one aspect of the present invention by an electrical connector system, comprising: an electrical connector having a plurality of signal contacts and in which the signal contacts exhibit unwanted cross-talk; and a circuit substrate engaging said connector. The substrate has a plurality of layers; and at least first, second and third traces on the circuit substrate, each corresponding to a respective signal contact. The first trace includes: a first portion on at least one of the plurality of layers and adjacent a portion of the second trace in order to produce a first compensating cross-talk; a second portion on at least one other of the plurality of layers and adjacent a portion of the third trace in order to produce a second compensating cross-talk. The first and second compensating cross-talks offset the unwanted cross-talk to provide an acceptable cross-talk.

These and other objects of the present invention are achieved in another aspect of the present invention by a circuit substrate for creating compensating cross-talk that minimizes unwanted cross-talk in signal contacts of an electrical connector. The substrate comprises a board having a first layer, a second layer, a plurality of inner layers between said first and second layers, and a ground plane on at least a lower surface of said board; at least first, second and third traces on the inner layers, the first trace having portions adjacent the second and third traces in order to produce a first and a second compensating cross-talk, respectively. The first and second compensating cross-talks offset the unwanted cross-talk to produce an acceptable cross-talk.

These and other objects of the present invention are achieved in another aspect of the present invention by a method of reducing unwanted cross-talk in an array of at least three conductors, comprising the steps of: introducing a first compensating cross-talk by inductively and capacitively coupling a first conductor and a second conductor adjacent the first conductor; and introducing a second compensating cross-talk by capacitively coupling the first conductor and a third conductor once removed from the first conductor. The compensating cross-talks offset the unwanted cross-talk to produce an acceptable crosstalk.

BRIEF DESCRIPTION OF THE DRAWINGS

Other uses and advantages of the present invention will become apparent to those skilled in the art upon reference to the specification and the drawings, in which.

DETAILED DESCRIPTION OF THE PREFERRED EMBODIMENTS

Figure 1A:
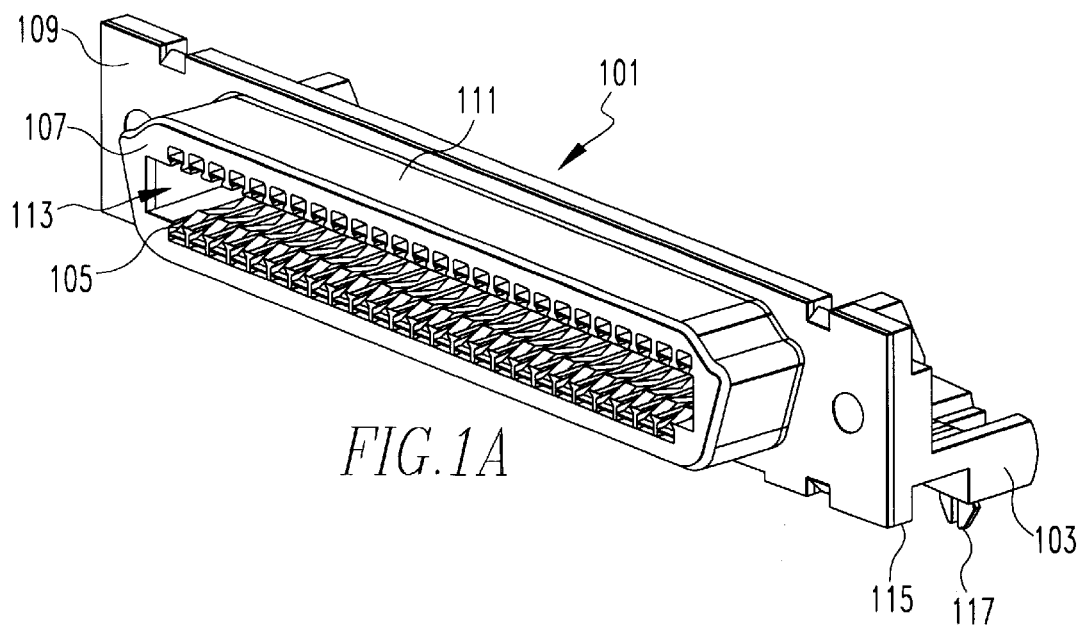
FIGS. 1A and 1B are front and side perspective views, respectively, of an electrical connector of the present invention.
Figure 1B:
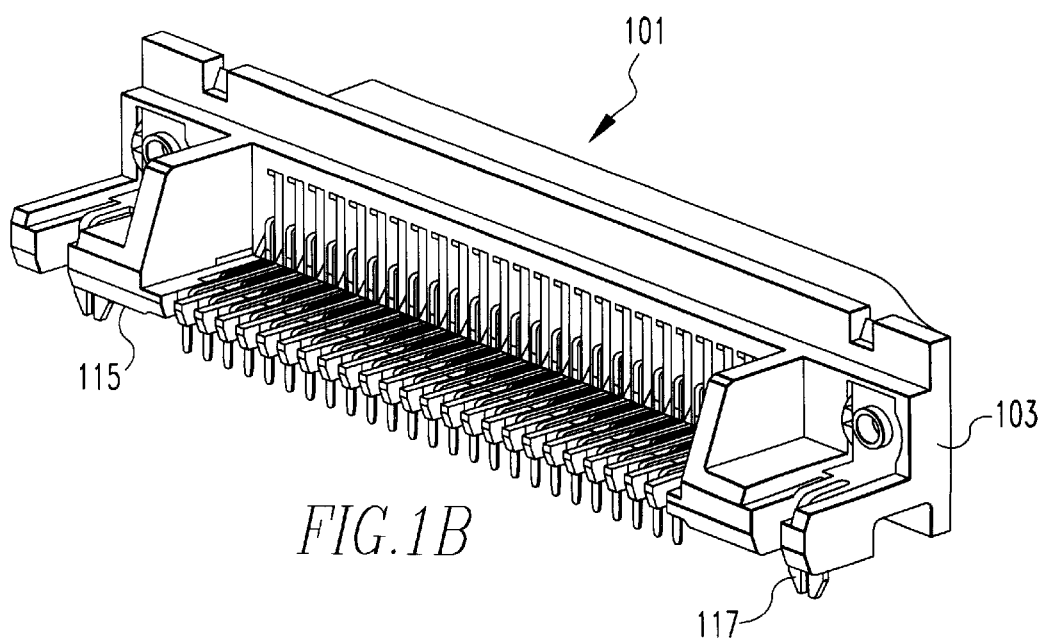

FIGS. 1A and 1B display an electrical connector 101, which could be a Category 5, 25 pair PCB receptacle connector such as part number 92509 available from FCI. Since a detailed recitation of the features of receptacle 101 is unnecessary for an understanding of the present invention, only a brief summary follows.

Receptacle 101 has an insulative housing 103 made from a suitable material such as 40% glass fiber reinforced polyphenylene sulfide (PPS). A series of contacts 105 extend through housing 103. Contacts 105 can be made from any suitable conductive material, including phosphorbronze, with a suitable plating finish, such as gold over nickel.

Receptacle 101 includes a mating portion 107 extending from a front face 109. A metal shell 111 covers front face 109 and surrounds the perimeter of mating portion 107. Mating portion 107 has a central opening 113 that accepts a mating electrical connector therein.

Figure 2A:
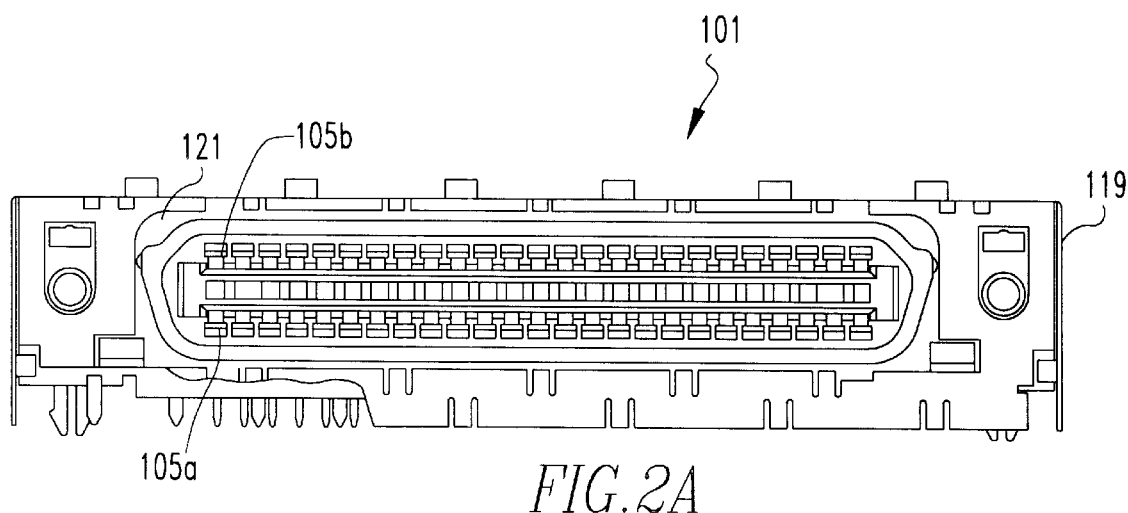
FIGS. 2A and 2B are front and side elevational views, respectively, of the electrical connector in FIGS. 1A and 1B with an exterior shield.

The mating ends of contacts 105 reside within mating portion 107 in two opposed rows. The mating ends of contacts 105 could be cantilever beams or propped cantilever beams which engage contacts in the mating electrical connector. As seen in FIG. 2A, superimposed contacts 105a, 105b within mating portion 107 define the differential pairs.

Contacts 105 extend past a mounting portion 115 of receptacle 101, for example, to engage through holes in a circuit substrate. The tails of contacts 105 extend from receptacle 101 in two rows. Mounting portion 113 could also include hold downs 117 that engage through holes in the circuit substrate to secure receptacle 101 temporarily to the circuit substrate before soldering.

Figure 2B:
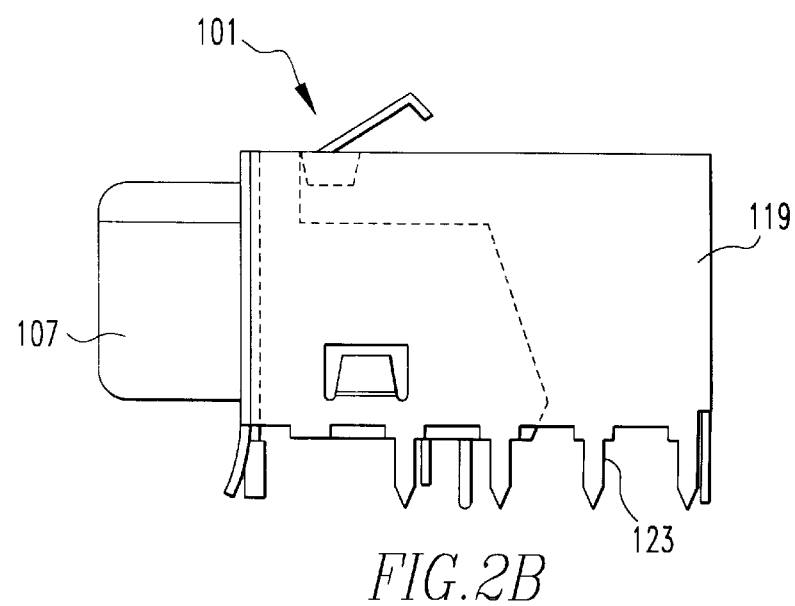

As shown in FIGS. 2A and 2B, receptacle 101 could also have an outer shield 119 to shield any electrical components surrounding receptacle 101 from electromagnetic interference (EMI) which could induce common mode noise in the cable. Shield 119 is preferably formed from a sheet of conductive material, such as phosphor bronze with a hot dip tin finish. Aside from an opening 121 through which mating portion 107 and shell 111 extend and the side abuts the circuit substrate, shield 119 surrounds receptacle 101. Shield 119 can include terminals 123 that enter through holes in the circuit substrate.

Figure 3A:
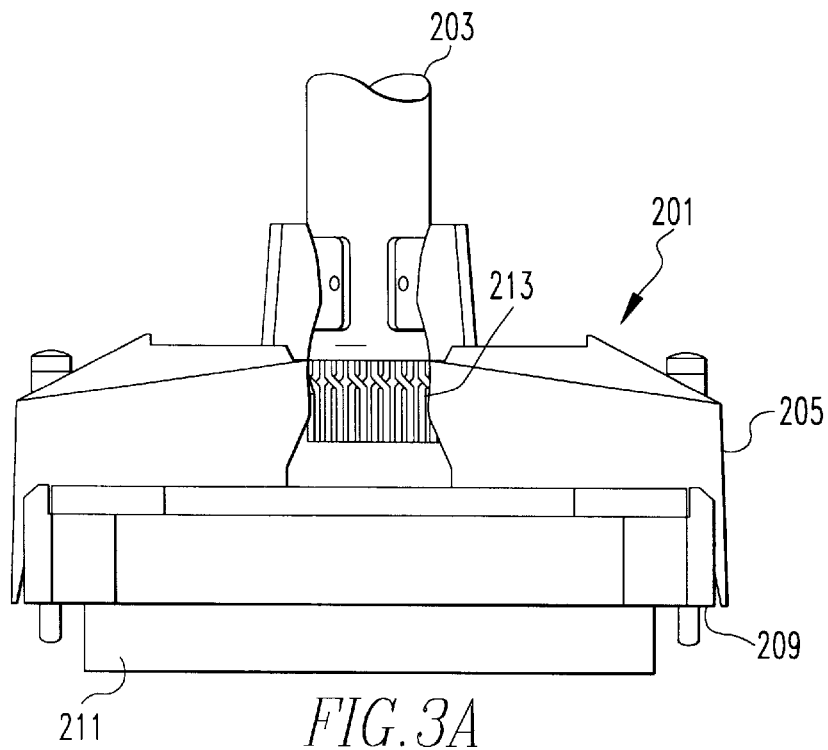
FIG. 3A is a top view of an electrical cable assembly mateable with the electrical connector in FIGS. 1A and 1B.
Figure 3B:
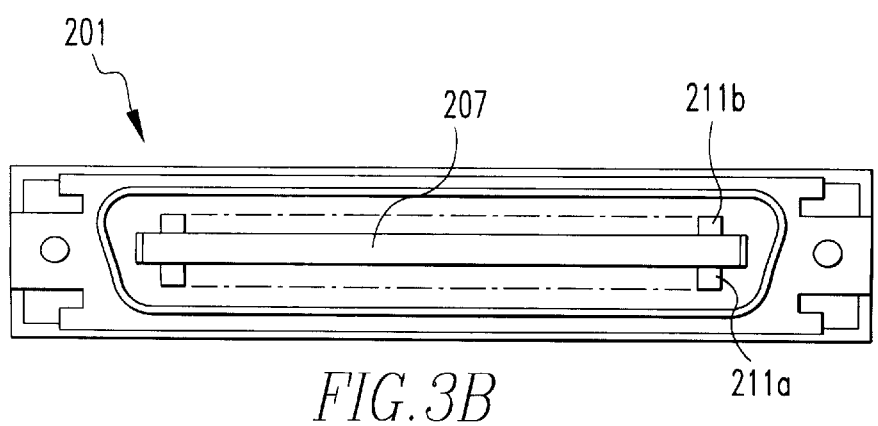
FIG. 3B is a front view of the electrical cable assembly in FIG. 3A.
Figure 4:
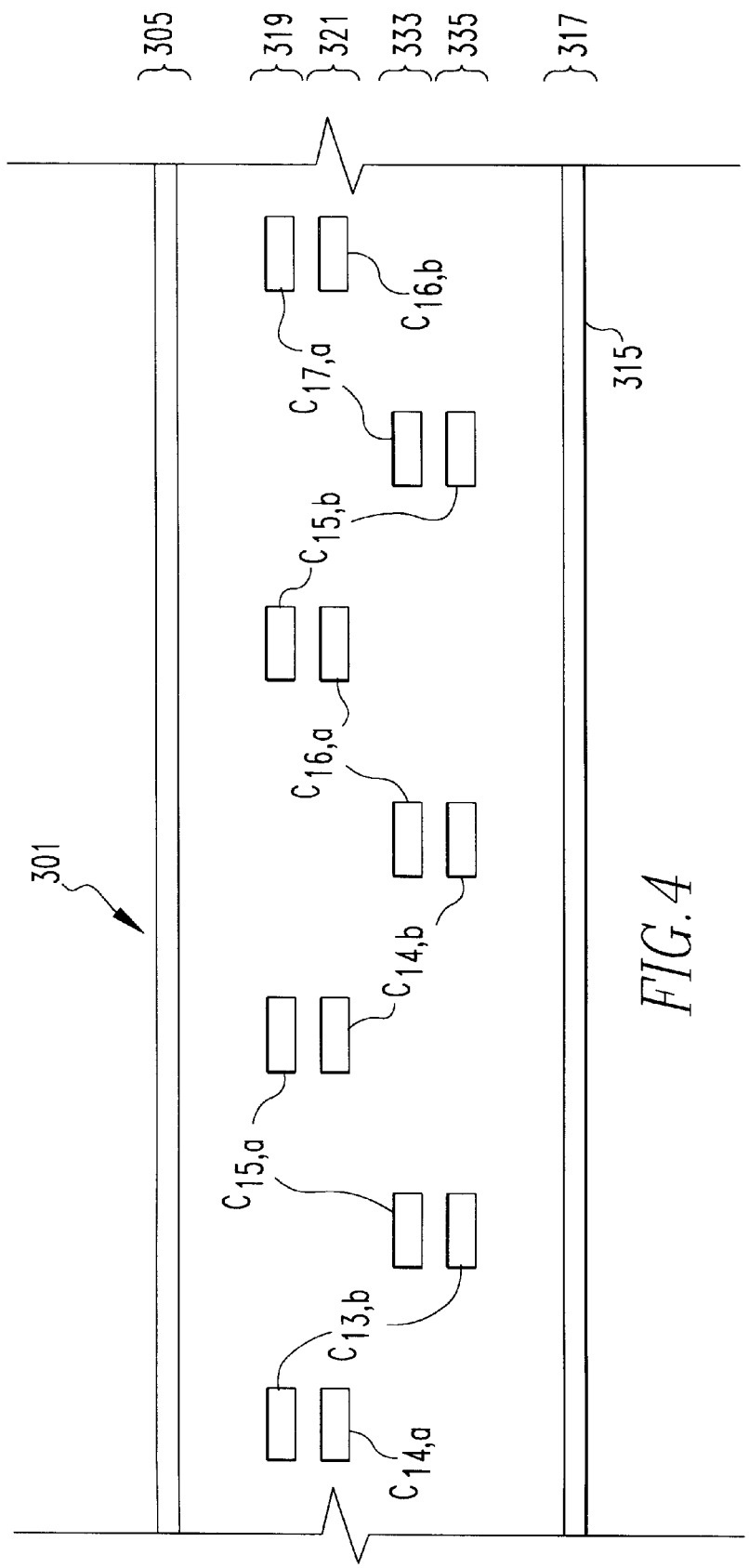
FIG. 4 is a partial cross-sectional view of one alternative embodiment of a multi-layer circuit substrate of the present invention taken along line IV—IV of FIG. 5.

Receptacle 101 mates with a suitable electrical connector, such as a Category 5, 25 pair cable plug 201 shown in FIGS. 3A and 3B. Plug 201 could, for example, be part number 86005 available from FCI. As with receptacle 101, a detailed recitation of the features of plug 201 is unnecessary for an understanding of the present invention. Thus, only a brief summary follows.

Plug 201 includes a cable 203 that terminates within a housing 205 made from a suitable insulative material, such as a thermoplastic. Housing 205 has a plate 207 extending from a mating face 209. Plate 209 enters opening 113 in mating portion 107 of receptacle 101 during mating.

A plurality contacts 211, such as insulation displacement contacts or any other suitable type of contact, extend through housing 205. Contacts 211 are preferably phosphor bronze with a gold over nickel finish in the contact area and a tin-lead over nickel finish in the terminal area.

One end of each contact 211 terminates to a respective wire 213 in the cable 203. The mating ends of each contact 213 extends along plate 207. As with receptacle 101, the mating ends of contacts 213 are arranged in two rows, each on an opposite side of plate 207. As seen in FIG. 3B, superimposed contacts 211a, 211b extending from housing 205 define the differential pairs. Upon mating of receptacle 101 and plug 201, contacts 211 engage contacts 105.

As with any connector system, cross-talk occurs between conductors in receptacle 101 and plug 201 (hereinafter referred to as unwanted cross-talk). The present invention introduces a cross-talk (hereinafter referred to as a compensating cross-talk) to each differential pair of the electrical connector system in order to reduce, or even cancel, the unwanted cross-talk. The present invention uses a predetermined pattern of traces on a portion of a multi-layer circuit substrate to introduce the compensating cross-talk. The compensating cross-talk described throughout may be in addition to any compensating cross-talk introducing within the connectors (not shown).

FIGS. 4–9 demonstrate a first alternative embodiment of a circuit substrate to which receptacle 101 mounts. The circuit substrate is made from a suitable dielectric material, such as a glass reinforced epoxy resin like FR4. The substrate comprises a plurality of layers formed by conventional techniques and sandwiched together by, for example, adhesive. In the particular arrangement shown in FIG. 4, multi-layer board (MLB) 301 should include at least 6 conductor layers.

Figure 5:
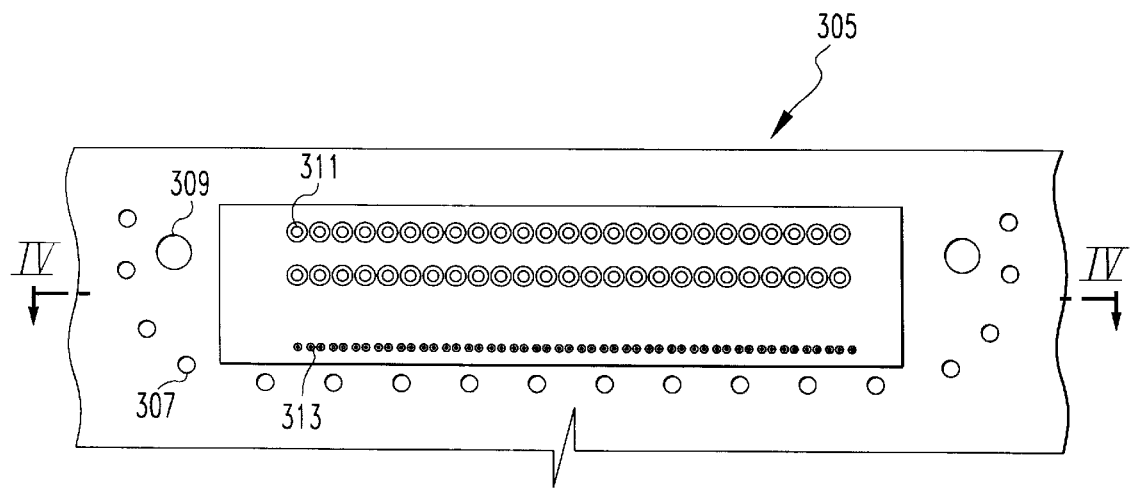
FIG. 5 is a plan view of the multi-layer circuit substrate shown in FIG. 4.

FIG. 5 displays an upper surface 303 of MLB 301, which is a part of an upper layer 305. Receptacle 101 mounts to upper surface 303 of MLB 301. In order to receive receptacle 101, upper layer 305 has plated through holes 307, 309 which correspond to and receive terminals 123 of shield 119 and hold downs 117 of receptacle 101, respectively, and which connect terminals 123 and hold downs 117 to the ground planes of MLB 301. Upper layer 303 also includes plated through holes 311 that receive the tails of contacts 105 of receptacle 101 and vias 313 to which the other circuitry (not shown) on MLB 301 are routed. In one possible arrangement and as shown in FIG. 5, through holes 311 could be arranged in two rows, while vias 313 are arranged in a single row. Other arrangements, however, are possible.

Most of the remainder of upper layer 303 could be a ground plane as illustrated in FIG. 5. In other words, the additional areas shown in FIG. 5, except where a clearance is needed at a plated through hole carrying a signal, could have a ground plane. If, however, receptacle 101 uses shield 119, then the ground plane in the area under shield 119 may be unnecessary (as seen in FIG. 5).

Similarly, a sixth layer 317 also preferably has a ground plane at locations other than those locations necessary for creating a clearance with a plated through hole carrying a signal. Sixth layer 317 is preferably a lower surface 315 of MLB 301. If more than six layers were necessary, then the additional areas would reside between upper first and sixth layers 305, 317. In a preferred embodiment, a 0.030" spacing exists between the ground plane on sixth layer 317 and the conductors on the fifth layer. As discussed above, should MLB 301 require more than six layers, the spacing between the conductors on the fifth layer and the ground plane on sixth layer 317 would be greater.

As discussed in more detail below, a predetermined arrangement of conductive paths extending between through holes 311 and vias 313 and on the various layers of MLB 301 to form the compensation pattern used to offset the unwanted cross-talk. The conductive paths are formed on the layers using conventional techniques such as photolithography. Generally speaking, each differential pair of traces or conductors $DP_n$ comprises two conductors $C_{n,a}$ and $C_{n,b}$. As an example, differential pair $DP_1$ has a first conductor $C_{1,a}$ and a second conductor $C_{1,b}$.

A second layer 319 and an adjacent third layer 321 are preferably used to create a compensating cross-talk that offsets unwanted cross-talk between adjacent conductors. Preferably, upper first layer 303 maintains a distance of approximately 0.030" from the conductors on second layer 319.

Second and third layers 319, 321 preferably utilize inductive and capacitive coupling between adjacent differential pairs $DP_n$, $DP_{n+1}$ to create the compensating cross-talk. Inductive coupling occurs because the conductors carry current between through holes 311 and vias 313. To achieve the capacitive coupling, conductors from adjacent differential pairs reside on alternating layers. For example, FIG. 6A displays second layer 319 having conductors thereon from a first differential pair $DP_1$, a third differential pair $DP_3$ and a fifth differential pair $DP_5$.

Figure 7:
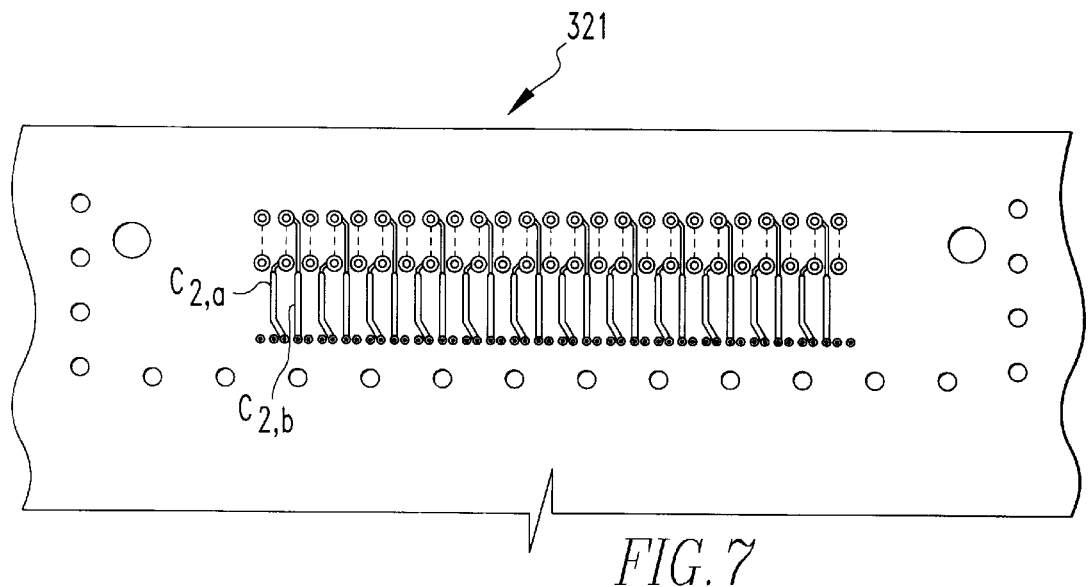
FIG. 7 is a plan view of another layer of the multi-layer circuit substrate shown in FIG. 4.

FIG. 7 displays third layer 321 having conductors thereon from a second differential pair $DP_2$ and a fourth differential pair $DP_4$. In a preferred embodiment, conductors on second and third layer 319, 321 are vertically spaced approximately 0.005".

Figure 6A:
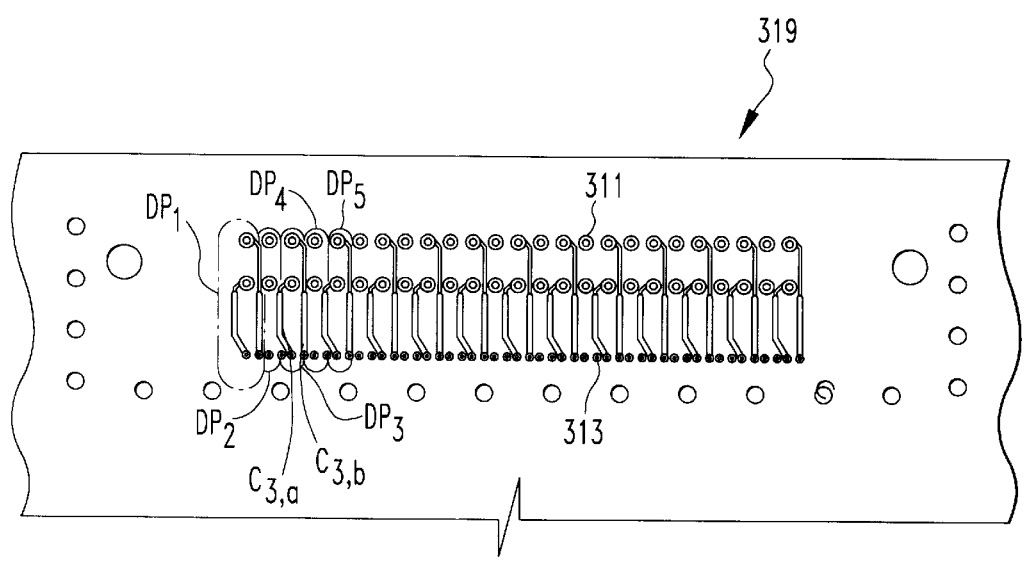
FIG. 6A is a plan view of one layer of the multi-layer circuit substrate shown in FIG. 4.

Referring to FIG. 6A, each conductor of alternating differential pairs extend from through hole 311 to via 313 on second layer 319. Referring to the detailed view of FIG. 6B, conductor $C_{3,a}$ includes a longitudinally extending portion 323 flanked by laterally extending portions 325, 327. Lateral portions 325, 327 ensure that longitudinal portion 323 generally extends to via 313 from a location generally between adjacent through holes 311.

Conductor $C_{3,b}$ includes a laterally extending portion 329 and a longitudinally extending portion 331. Lateral portion 329 ensures that longitudinal portion 331 generally extends to via 313 from a location generally between adjacent through holes, but on an opposite side of through hole 311 from conductor $C_{3,a}$.

Third layer 321 has the same conductor pattern as second layer 319. The only difference between third layer 321 and second layer 319 is that each layer accommodates different differential pairs. FIG. 7 shows, for example, that conductors $C_{2,a}$ and $C_{2,b}$ on third layer 321 follow the same pattern as conductors $C_{3,a}$ and $C_{3,b}$ on second layer 319.

Figure 6B:
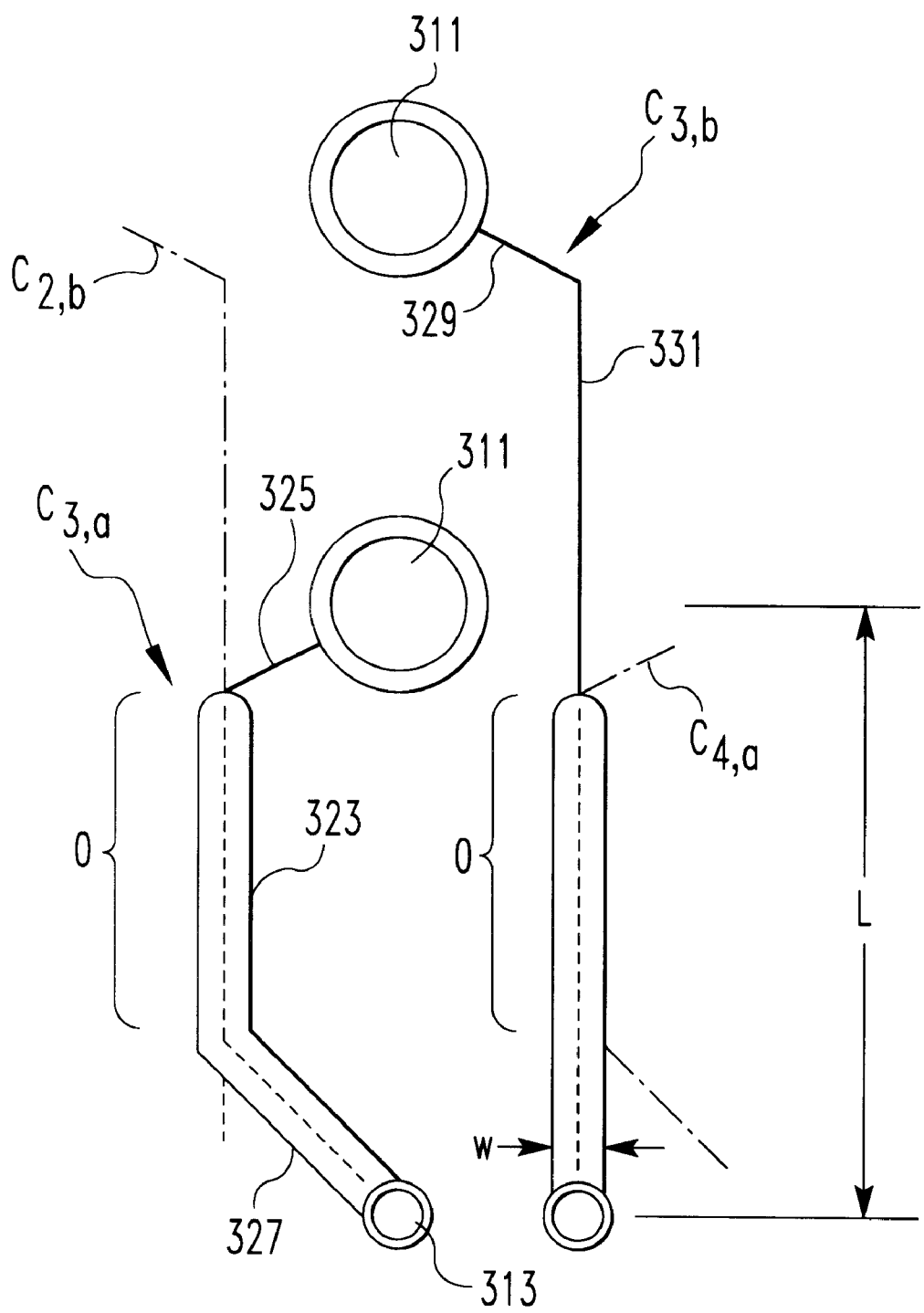
FIG. 6B is a detailed view of a part of the layer in FIG. 6A with conductors from an adjacent layer shown in phantom.

In addition to positioning longitudinal portions 323, 331 relative to through holes 311, lateral portions 325, 327, 329 also position longitudinal portions 323, 331 relative to the longitudinal portions of the conductors on third layer 321. As seen in FIG. 6B, an overlap O occurs between certain conductors on second layer 319 and third layer 321. This overlap O creates the compensating cross-talk to offset unwanted cross-talk between adjacent pairs (e.g. $DP_n$, $DP_{n+1}$).

The geometry of the conductors and the spacing between second layer 319 and third layer 321 determines the amount of compensating cross-talk. Each conductor on second and third layer 319, 321 has a narrow interconnection portion and a wide compensation portion. The compensation discussed herein generally occurs in the wide portion of the conductors.

FIG. 6B demonstrates that lateral portion 325 of conductor $C_{3,a}$ forms the narrow portion and longitudinal portion 323 and lateral portion 327 form the wide portions. FIG. 6B also demonstrates that lateral portion 329 and a portion of longitudinal portion 331 of conductor $C_{3,b}$ form the narrow portion and the remainder of longitudinal portion 331 forms the wide portion.

Therefore, as clearly shown in FIG. 6B, the wide portions of the conductors occupy the overlaps O with the conductors on the adjacent layer of MLB 301. Width W of the wide portions of the conductors is selected to produce the desired amount of compensating cross-talk. In fact, the width W suitable to form the desired amount of compensating cross-talk depends upon a length L between through holes 311 and vias 313. Generally speaking, for wider widths W, the optimum length L is shorter, but the resulting power sum cross-talk is larger.

For example, with a length L of 0.282" between a 0.052" diameter pad at through hole 311 and a 0.0290" diameter pad at via 313, a 0.001" thick conductor should have a wide portion width of 0.016". The narrow portion width could be approximately 0.008".

Subsequent layers of MLB 301 are preferably used to create a compensating cross-talk that offsets unwanted cross-talk between non-adjacent conductors. The remaining layers preferably use capacitive coupling between non-adjacent differential pairs to create the compensating cross-talk. Preferably, the conductors of the subsequent layers are spaced approximately 0.011" from the conductors in third layer 321.

In order to clarify the terminology used below, FIG. 6A shows that third differential pair $DP_3$ is "once removed" from first differential pair $DP_1$. In other words, second differential pair $DP_2$ resides between first differential pair $DP_1$ and third differential pair $DP_3$. Furthermore, fourth differential pair $DP_4$ is "twice removed" from differential pair $DP_1$. In other words, second and third differential pairs $DP_2$, $DP_3$ reside between first differential pair $DP_1$ and fourth differential pair $DP_4$.

In this alternative embodiment, a fourth layer 333 and an adjacent fifth layer 335 create a compensating cross-talk to offset unwanted crosstalk between once removed conductors. To achieve this goal, each conductor $C_{n,a}$, $C_{n,b}$ from a differential pair $DP_n$ reside on alternating layers. For example, FIG. 8A displays fourth layer 333 having conductor $C_{3,a}$ from differential pair $DP_3$. The other conductor $C_{3,b}$ from differential pair $DP_3$ resides on fifth layer 335. In a preferred embodiment, conductors on fourth and fifth layer 333, 335 are vertically spaced approximately 0.005".

Figure 8A:
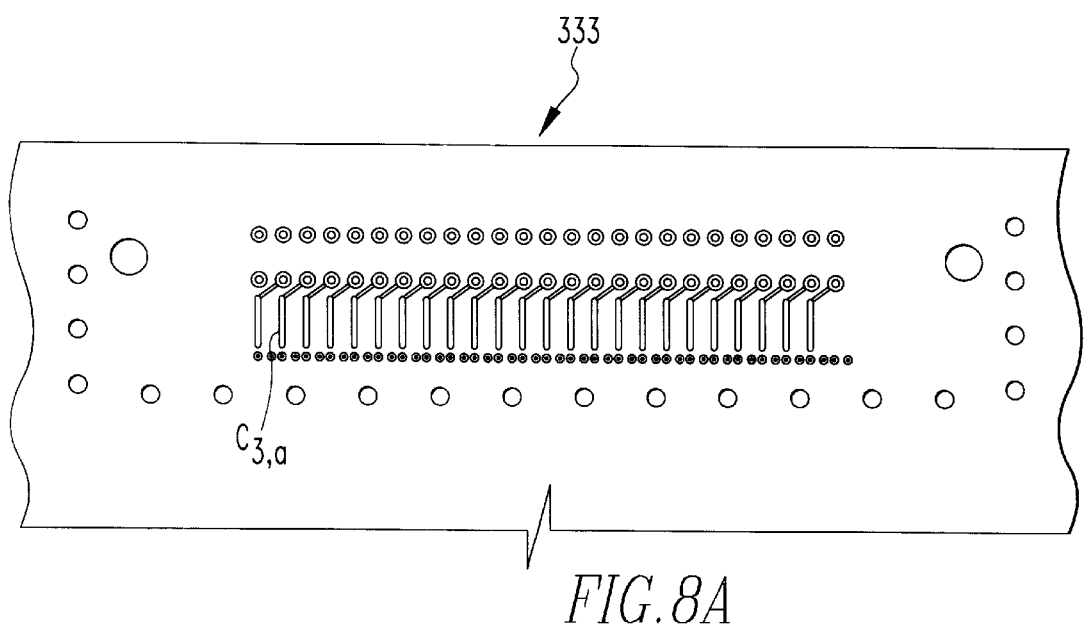
FIG. 8A is a plan view of another layer of the multi-layer circuit substrate shown in FIG. 4.
Figure 8B:
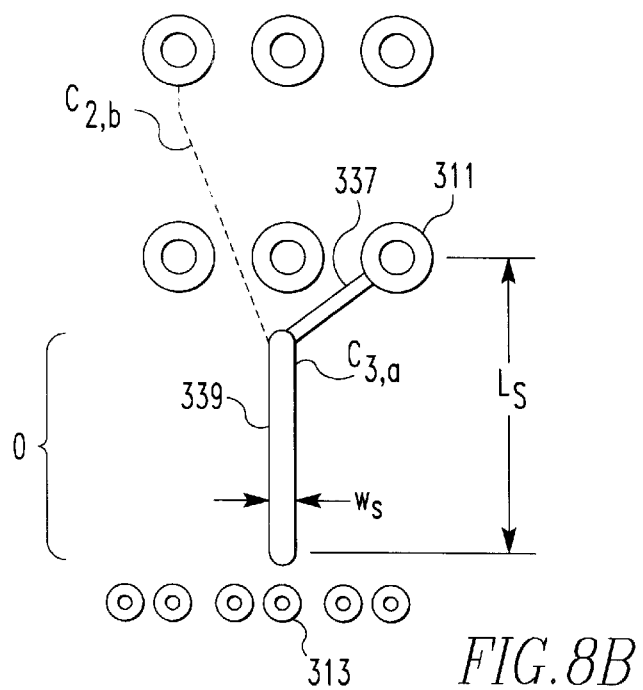
FIG. 8B is a detailed view of a part of the layer in FIG. 8A with conductors from an adjacent layer shown in phantom.

Referring to the detailed view of FIG. 8B, conductor $C_{3,a}$ is a stub, not fully extending between through hole 311 and via 313. Conductor $C_{3,a}$ has a laterally extending portion 337 and a longitudinally extending portion 339. Laterally extending portion 337 aligns longitudinal portion 339 with an adjacent via 313.

Figure 9:
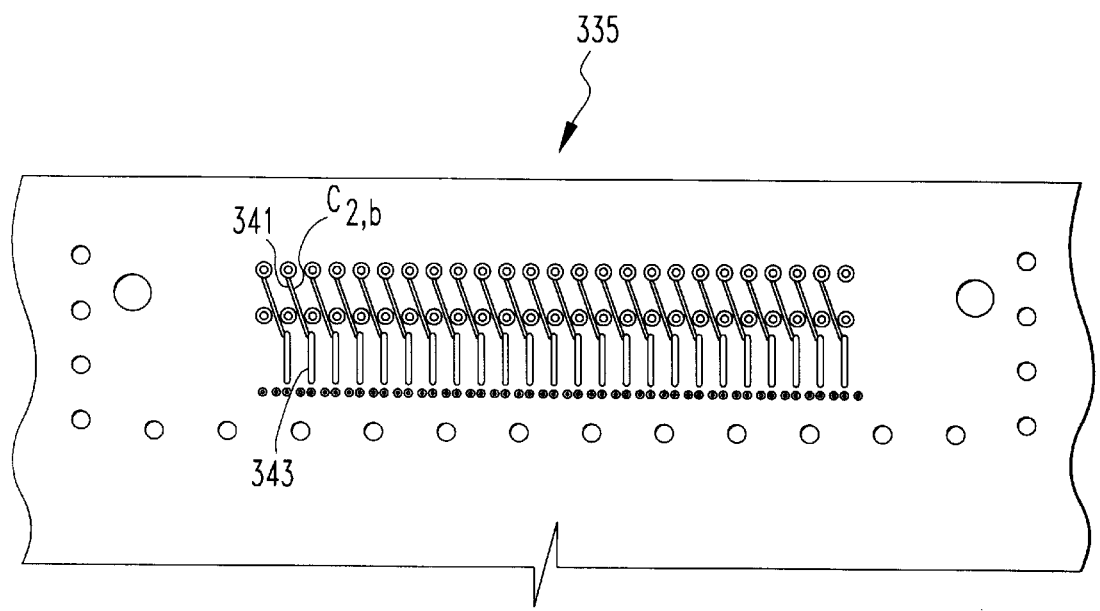
FIG. 9 is a plan view of another layer of the multi-layer circuit substrate shown in FIG. 4.

Fifth layer 335 has a somewhat similar arrangement. Referring to FIG. 9, conductor $C_{2,b}$ is a stub, not fully extending between through hole 311 and via 313. Conductor $C_{2,b}$ has a laterally extending portion 341 and a longitudinally extending portion 343. Laterally extending portion 341 aligns longitudinal portion 343 with an adjacent via 313. In particular, and as shown in FIG. 8B, lateral portions 337, 341 position their respective longitudinal portions 339, 343 so as to overlap O. This overlap creates the compensating cross-talk to offset unwanted cross-talk between once removed pairs (e.g. $DP_n$, $DP_{n+2}$).

The geometry of the conductors and the spacing between fourth and fifth layers 333, 335 determines the amount of compensating cross-talk. Each conductor on fourth and fifth layers 333, 335 has a narrow portion and a wide portion. For example, FIGS. 8A and 9 demonstrate that lateral portions 337, 341 of conductors $C_{3,a}$, $C_{2,b}$ form the narrow portions and longitudinal portions 339, 343 form the wide portions.

Therefore, as clearly shown in FIG. 8B, the wide portions of the conductors occupy the overlaps O with the conductors on the adjacent layer of MLB 301. Width WS of the wide portions of the conductors is selected to form the desired amount of compensating cross-talk. In fact, the width W. suitable to form the desired amount of compensating cross-talk depends upon a stub length $L_s$. Generally speaking, for longer stub lengths $L_s$, width W should be smaller.

For example, with a length L of 0.282" between a 0.052" diameter pad at through hole 311 and a 0.0290" diameter pad at via 313, a 0.001" thick conductor with a stub length L. of 0.249" should have a wide portion width of 0.016". The narrow portion width could be approximately 0.008".

Figure 10:
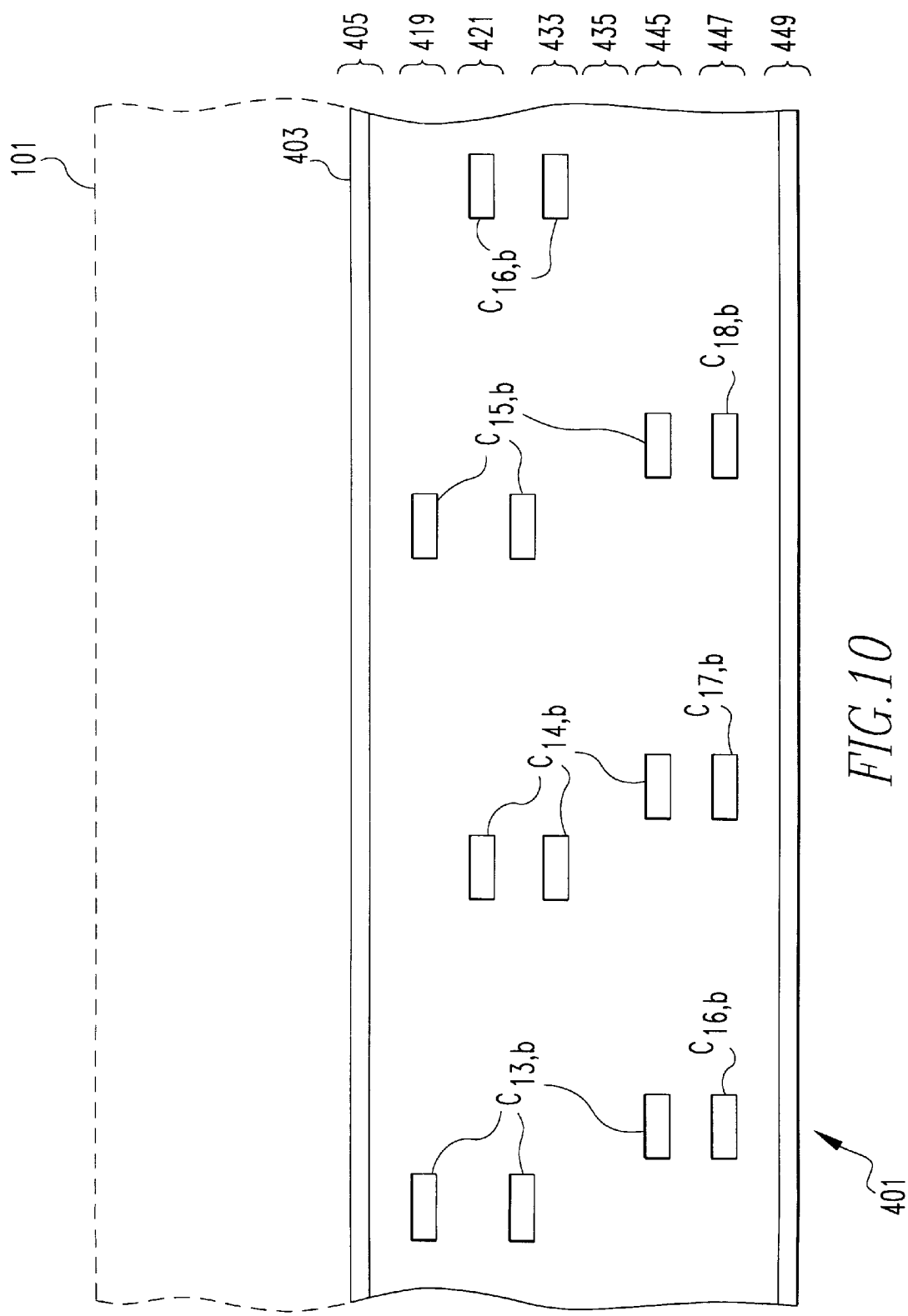
FIG. 10 is a cross-sectional view of another alternative embodiment of a multi-layer circuit substrate of the present invention taken along lines X—X in FIG. 11A.
Figure 11A:
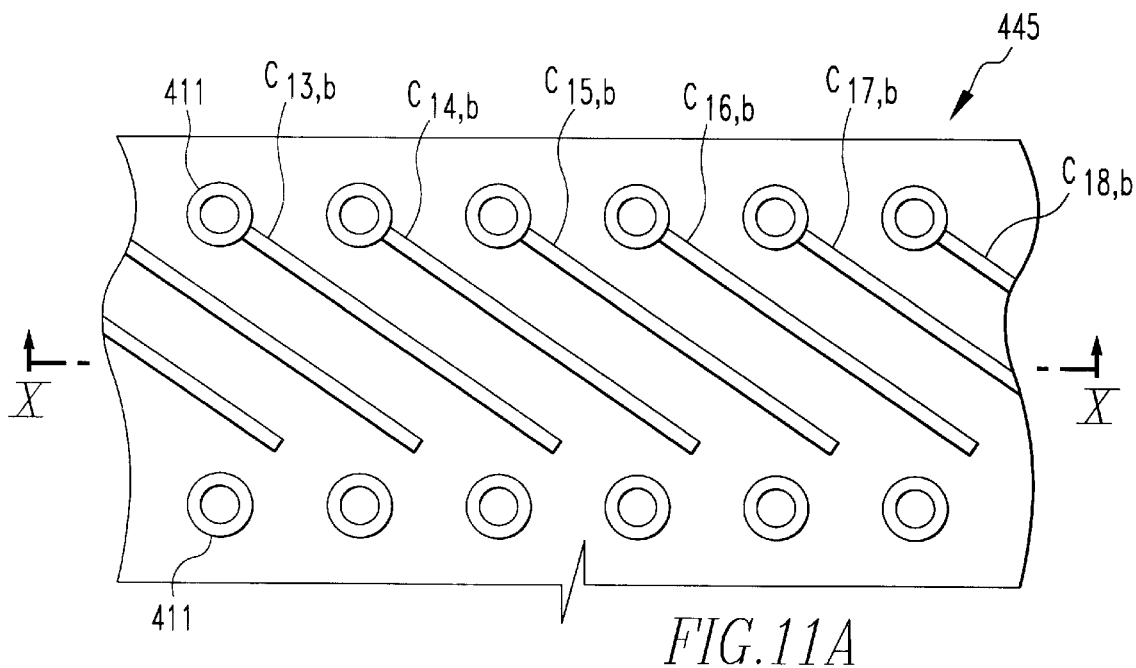
FIG. 11A is a plan view of a layer of the multi-layer circuit substrate shown in FIG. 10.
Figure 12:
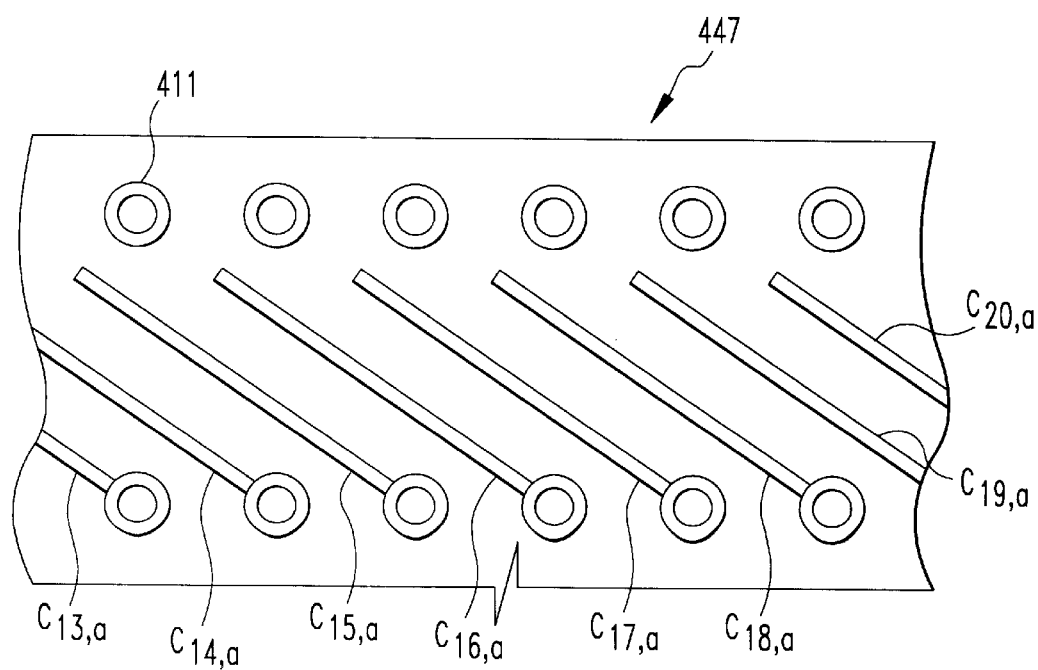
FIG. 12 is a plan view of another layer of the multi-layer circuit substrate shown in FIG. 10.

FIGS. 10–12 display a second alternative embodiment of a circuit substrate to which receptacle 101 mounts. As with the first alternative embodiment, the substrate comprises a plurality of layers. Different than MLB 301, a multi-layer board (MLB) 401 of the second alternative embodiment has at least two more layers.

Features of MLB 401 that are similar to MLB 301 will now be briefly discussed. MLB 401 has a upper layer 405, second layer 419, third layer 421, fourth layer 433 and fifth layer 435. Upper layer 405 includes an upper surface of MLB 401 and interacts with receptacle 101. Second and third layers 419, 421 create a compensating cross-talk between adjacent conductors (such as second and third differential pairs $DP_2$, $DP_3$). Fourth and fifth layers 433, 435 create a compensating cross-talk between once removed conductors (such as second and fourth differential pairs $DP_2$, $DP_4$).

Differently than MLB 301, MLB 401 includes at least two additional layers that create compensating cross-talk in the conductors. MLB 401 includes a sixth layer 445 and an adjacent seventh layer 447. Preferably, conductors on sixth and seventh layers 445, 447 are vertically spaced approximately 0.005".

First layer 405 and an eighth layer 449 flank second, third, fourth, fifth, sixth and seventh layers 419, 421, 433, 435, 445, 447. Preferably, first and eighth layers 405, 449 comprise ground planes. As with the first alternative embodiment, no ground plane may be necessary on upper layer 405 in the region of the compensation pattern should receptacle 101 include shield 119.

Sixth and seventh layers 445, 447 preferably create a compensating cross-talk that offsets unwanted cross-talk between twice removed conductors. To achieve this goal, each conductor $C_{n,a}$, $C_{n,b}$ from a differential pair $DP_n$ resides on alternating layers. For example, FIG. 11A displays sixth layer 445 having conductor $C_{13,b}$ from thirteenth differential pair $DP_{13}$. The other conductor $C_{13,a}$ from thirteenth differential pair $DP_{13}$ resides on seventh layer 447.

Referring to FIG. 11A, conductor $C_{13,b}$ is a stub, not fully extending between the rows of through holes 411. Conductor $C_{13,b}$ extends diagonally from through hole 411 associated with thirteenth differential pair $DP_{13}$ towards through hole 411 associated with a sixteenth differential pair $DP_{16}$.

Figure 11B:
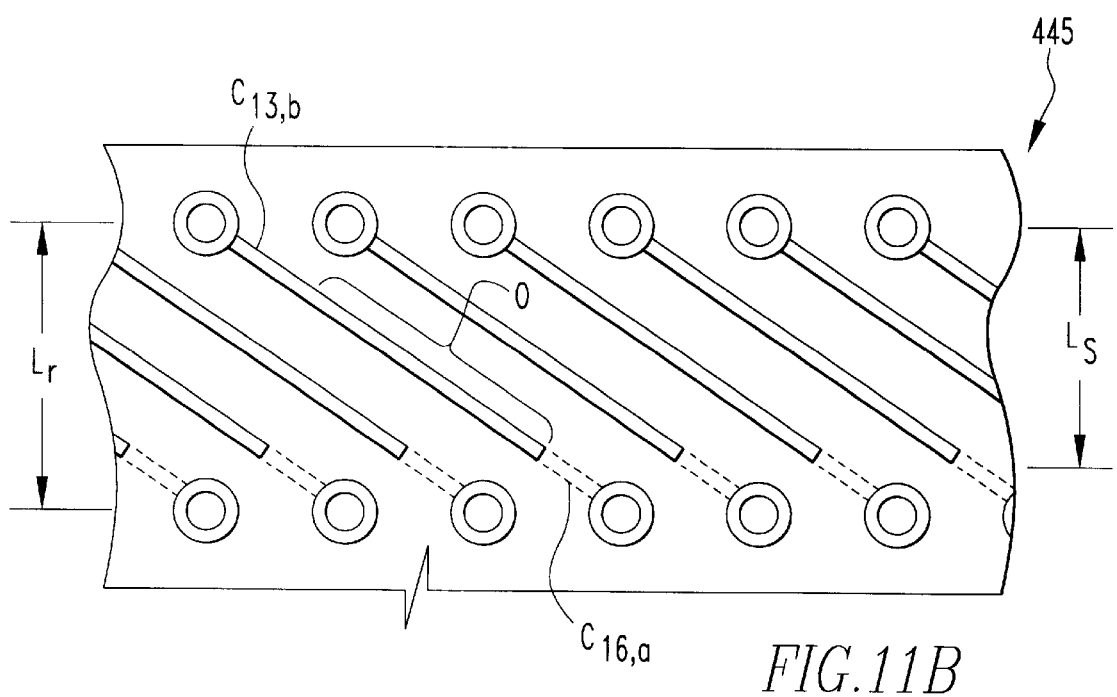
FIG. 11B is the layer shown in FIG. 11 with the conductors from an adjacent layer shown in phantom.

Seventh layer 447 has a similar arrangement. Referring to FIG. 12, conductor $C_{16,a}$ is a stub, not fully extending between the rows of through holes 411. Conductor $C_{16,a}$ extends diagonally from through hole 411 associated with sixteenth differential pair $DP_{16}$ towards through hole 411 associated with a thirteenth differential pair $DP_{13}$. The positioning of the conductors provides an overlap O between twice removed conductors as seen in FIG. 11B. This overlap O creates the compensating cross-talk to offset the unwanted cross-talk between twice removed pairs (e.g. $DP_n$, $DP_{n+3}$).

The geometry of the conductors and the spacing between the sixth and seventh layers 445, 447 determines the amount of compensating cross-talk. Each conductor on sixth and seventh layers 445, 447 preferably has a generally uniform width. The width of the conductors is selected to form the desired amount of compensating cross-talk. In fact, the width suitable to form the desired amount of compensating cross-talk depends on the length of overlap O. Generally speaking, for longer lengths of overlap O, the smaller the width of the conductor can be. For shorter lengths of overlap O, the greater the width of the conductor can be.

For example, it is estimated that with an overlap O of approximately 0.100", a 0.0011" thick conductor should have a width of approximately 0.016".

Figure 13:
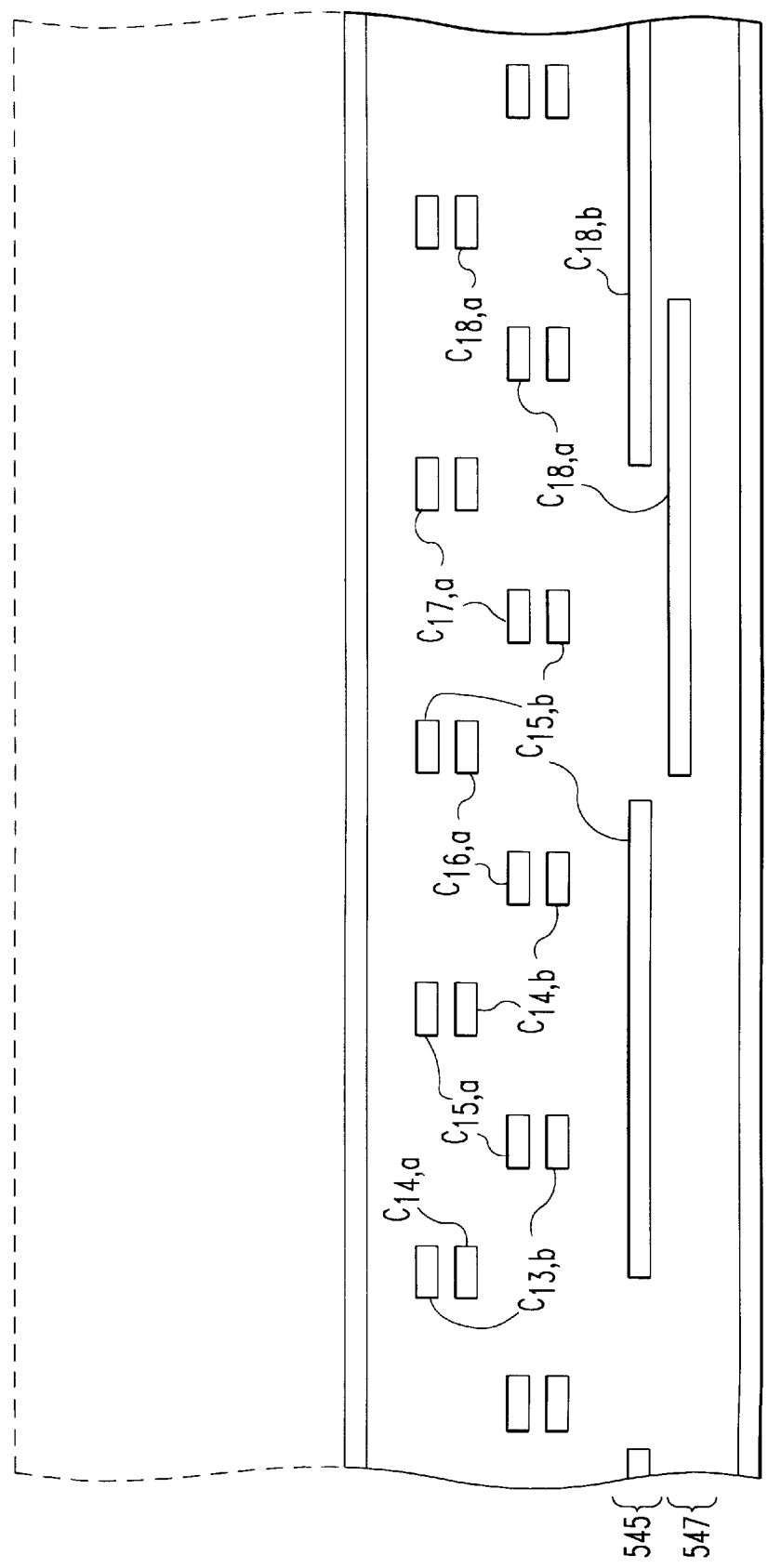
FIG. 13 is a cross-sectional view of another alternative embodiment of a multi-layer circuit substrate of the present invention taken along lines XIII—XIII of FIG. 14.
Figure 14:
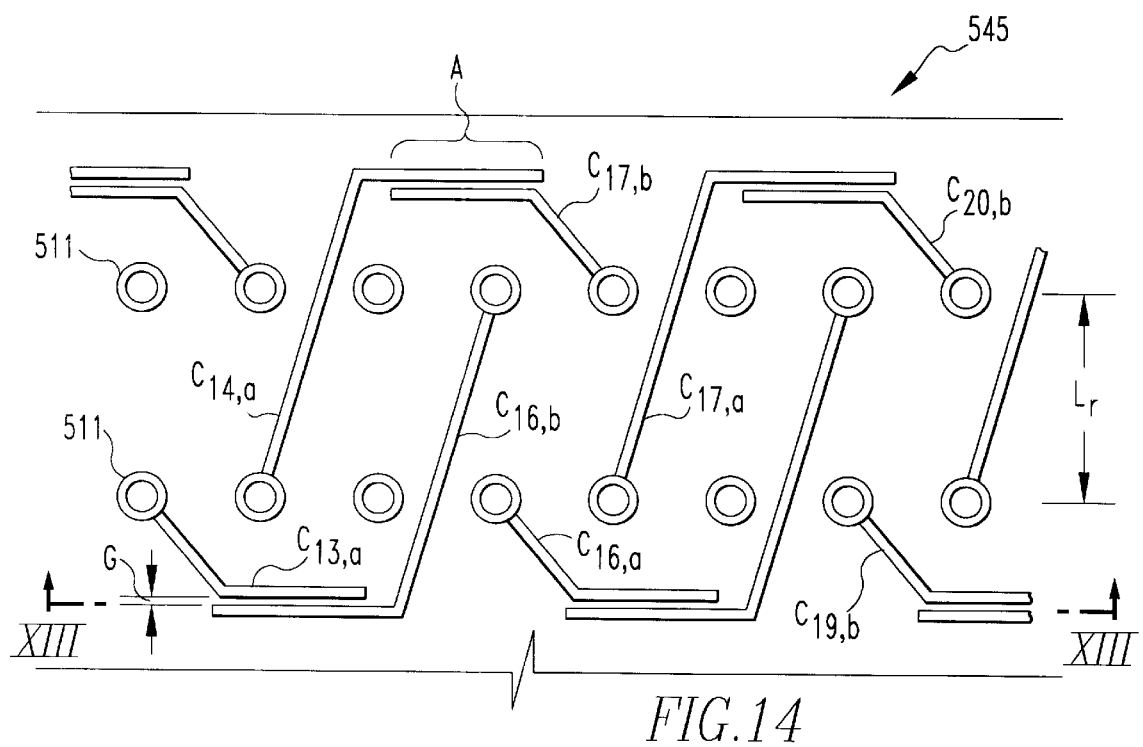
FIG. 14 is a plan view of one layer of the multi-layer circuit substrate shown in FIG. 13.
Figure 15:
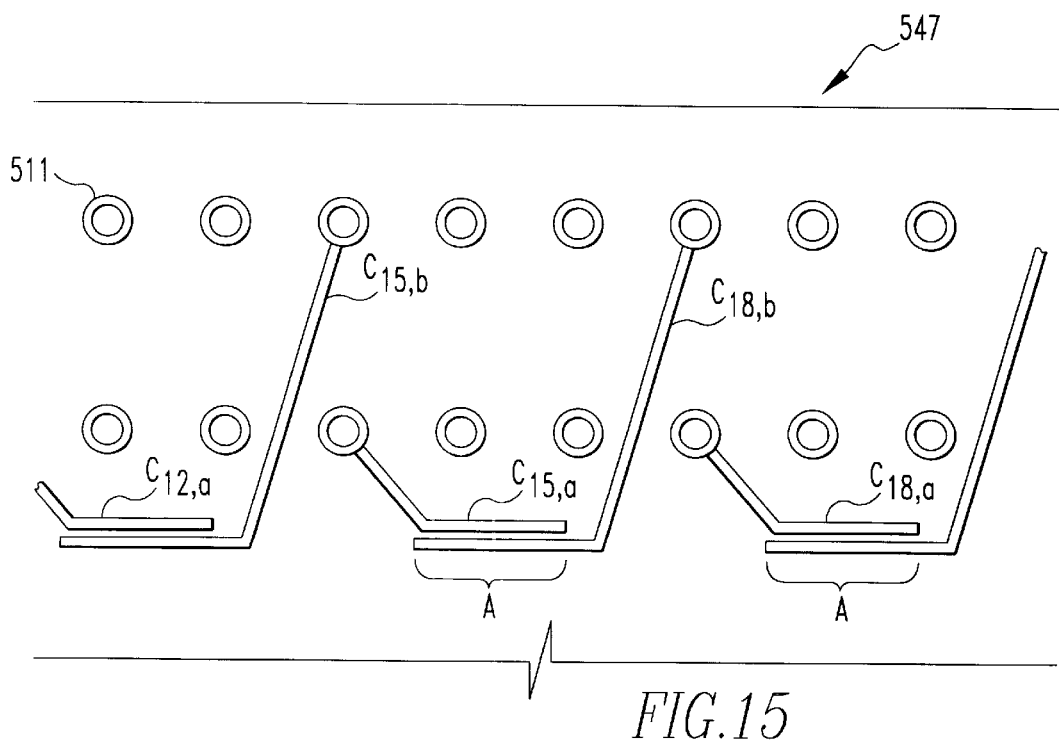
FIG. 15 is a plan view of another layer of the multi-layer circuit substrate shown in FIG. 13.

FIGS. 13–15 display a third alternative embodiment of a circuit substrate to which receptacle 101 mounts. In this alternative embodiment, the substrate comprises a multi-layer board (MLB) 501. MLB 501 closely resembles MLB 401, save the sixth and seventh layers.

As seen in FIG. 13, a sixth layer 545 and an adjacent seventh layer 547 have conductors thereon. As with the second alternative embodiment, sixth and seventh layers 445, 447 preferably create a compensating cross-talk that offsets unwanted cross-talk between twice removed conductors. FIGS. 14 and 15 demonstrate the particular arrangement of conductors on the sixth and seventh layers 445, 447.

As seen in FIG. 14, sixth layer 545 displays conductor $C_{16,b}$ from sixteenth differential pair $DP_{16}$ extending forwardly to a position adjacent conductor $C_{13,a}$ from thirteenth differential pair $DP_{13}$. Conductors $C_{16,b}$, $C_{13,a}$ extend adjacently at an area A to create the necessary compensating cross-talk between twice removed conductors.

The other conductor $C_{16,a}$ from sixteenth differential pair $DP_{16}$ extends forwardly to a position adjacent conductor $C_{19,b}$ from nineteenth differential pair $DP_{19}$. Conductors $C_{16,a}$, $C_{19,b}$ extend adjacently at an area A to create the necessary compensating cross-talk between twice removed conductors.

The conductors from an adjacent differential pair extend rearwardly to overlap with their corresponding twice removed conductors. As seen in FIG. 14, conductor $C_{17,b}$ from seventeenth differential pair $DP_{17}$ extends rearwardly to a position adjacent conductor $C_{14,a}$ from fourteenth differential pair $DP_{14}$. The other conductor $C_{17,a}$ from seventeenth differential pair $DP_{17}$ extends rearwardly to a position adjacent conductor $C_{20,b}$ from twentieth differential pair $DP_{20}$.

As seen in FIG. 15, seventh layer 547 displays conductor $C_{15,b}$ from fifteenth differential pair $DP_{15}$ extending forwardly to a position adjacent conductor $C_{12,a}$ from twelfth differential pair $DP_{12}$. An overlap O between conductors $C_{15,b}$, $C_{12,a}$ extend adjacently at area A to create the necessary compensating cross-talk between twice removed conductors.

The other conductor $C_{15,a}$ from fifteenth differential pair $DP_{15}$ extends forwardly to a position adjacent conductor $C_{18,b}$ from eighteenth differential pair $DP_{18}$. Conductors $C_{15,a}$, $C_{18,b}$ c extend adjacently at area A to create the necessary compensating cross-talk between twice removed conductors. Comparing FIGS. 14 and 15, the conductors on seventh layer 547 extend further from through holes 511 than the conductors on sixth layer 545. This prevents any adverse cross-talk between the conductors on the adjacent sixth and seventh layers 545, 547. Alternatively, however, the conductors on seventh layer 547 could extend to a position medial the rows of through holes 511 (not shown). This location would also prevent adverse cross-talk between conductors on the adjacent sixth and seventh layers 545, 547.

Referring to FIGS. 14 and 15, the conductors are stubs, not electrically connecting through holes 411. The geometry of the conductors and the spacing between the sixth and seventh layers 545, 547 and between adjacent conductors determines the amount of compensating cross-talk. Each conductor on sixth and seventh layers 545, 547 preferably has a generally uniform width. The width of the conductors and a gap G between the conductors is selected to form the desired amount of compensating cross-talk.

In fact, the width suitable to form the desired amount of compensating cross-talk depends on the length of an overlap A. Generally speaking, for smaller gaps G, the smaller the length of overlap A can be. For greater lengths of gaps G, the greater the length of overlap A can be.

For example, with a gap G of 0.006" and a width W of 0.008", it is estimated that a 0.001" thick conductor should have a length of overlap A of approximately 0.150".

While the present invention has been described in connection with the preferred embodiments of the various figures, it is to be understood that other similar embodiments may be used or modifications and additions may be made to the described embodiment for performing the same function of the present invention without deviating therefrom. Therefore, the present invention should not be limited to any single embodiment, but rather construed in breadth and scope in accordance with the recitation of the appended claims.

What is claimed is:

1. An electrical connector system, comprising:
   an electrical connector having a plurality of signal contacts, said connector exhibiting unwanted cross-talk between said signal contacts; and
   a circuit substrate engaging said connector and having:
      a plurality of layers; and
      at least first, second and third traces on said circuit substrate, each corresponding to a respective signal contact;
   wherein said first trace includes:
      a first portion on at least one of said plurality of layers and adjacent a portion of said second trace in order to produce a first compensating cross-talk;
      a second portion on at least one other of said plurality of layers and adjacent a portion of said third trace in order to produce a second compensating cross-talk;
   whereby said first and second compensating cross-talks offset said unwanted cross-talk to provide an acceptable cross-talk.

2. The electrical connector system as recited in claim 1, wherein said first portion of said first trace resides on a first layer and said portion of said second trace resides on an adjacent second layer.

3. The electrical connector system as recited in claim 2, wherein said first portion of said first trace is superimposed over said portion of said second trace.

4. The electrical connector system as recited in claim 2, wherein said second portion of said first trace resides on a third layer and said portion of said third trace resides on an adjacent fourth layer.

5. The electrical connector system as recited in claim 4, wherein said second portion of said first trace is superimposed over said portion of said third trace.

6. The electrical connector system as recited in claim 1, wherein said circuit substrate further comprises a fourth trace, and said first trace further comprises a third portion on at least one other of said plurality of layers and adjacent a portion of said fourth trace in order to produce a third compensating cross-talk, whereby said first, second and third compensating cross-talks offset said unwanted cross-talk to provide said acceptable cross-talk.

7. The electrical connector system as recited in claim 6, wherein said third portion of said first trace resides on a different layer than said fourth trace.

8. The electrical connector system as recited in claim 6, wherein said third portion of said first trace resides on the same layer as said fourth trace.

9. The electrical connector system as recited in claim 6, wherein said unwanted cross-talk and said first, second and third compensating cross-talks are next-end cross-talks.

10. The electrical connector as recited in claim 6, wherein said first, second and third portions of said first trace reside entirely underneath said connector.

11. The electrical connector system as recited in claim 1, wherein said first, second and third traces each comprise one of a pair of traces that form differential pairs.

12. The electrical connector as recited in claim 1, wherein said first and second portions of said first trace reside entirely underneath said connector.

13. A circuit substrate for creating compensating cross-talk that minimizes unwanted cross-talk in signal contacts of an electrical connector, comprising:
   a board having an upper layer, a second layer, a plurality of inner layers between said upper layer and said second layer, and a ground plane on at least a lower surface of said board; and
   at least first, second, and third traces on said inner layers, said first trace having first and second portions, said first portion being located on a first of said inner layers and adjacent said second conductor in order to produce a first compensating cross-talk, said second portion being located on a second of said inner layers and adjacent said third conductor in order to produce a second compensating cross-talk;

whereby said first and second compensating cross-talks offset said unwanted cross-talk to produce an acceptable cross-talk.

14. The circuit substrate as recited in claim 13, further comprising a fourth trace, said first trace having a portion adjacent said fourth trace in order to produce a third compensating cross-talk; whereby said first, second and third compensating cross-talks offset said unwanted cross-talk to produce said acceptable cross-talk.

15. The circuit substrate as recited in claim 14, wherein said unwanted cross-talk and said first, second and third compensating cross-talks are near-end cross-talks.

16. The circuit substrate as recited in claim 13, wherein said ground plane is on said second layer.

17. The circuit substrate as recited in claim 13, wherein said ground plane is disposed on said upper layer of said board.

18. The circuit substrate as recited in claim 13, in combination with an electrical connector, said connector including a shell overlying a portion of said board producing said compensating cross-talks.

19. A method of reducing unwanted cross-talk in an array of at least three conductors, comprising the steps of:
introducing a first compensating cross-talk by inductively and capacitively coupling a first conductor and a second conductor adjacent said first conductor; and
introducing a second compensating cross-talk by capacitively coupling said first conductor and a third conductor once removed from said first conductor;
wherein said compensating cross-talks offset the unwanted cross-talk to produce an acceptable cross-talk.

20. The method of reducing unwanted cross-talk as recited in claim 19, wherein the array includes at least four conductors and further comprising the step of:
introducing a third compensating cross-talk by capacitively coupling said first conductor and a fourth conductive twice removed from said first conductor.

* * * * *